(12) United States Patent
Gebeyehu et al.

(10) Patent No.: US 12,095,422 B2
(45) Date of Patent: Sep. 17, 2024

(54) POWER AMPLIFIERS WITH SUPPLY CAPACITOR SWITCHING

(71) Applicant: Skyworks Solutions, Inc., Irvine, CA (US)

(72) Inventors: Netsanet Gebeyehu, San Jose, CA (US); Weiya Gong, San Jose, CA (US); Shao-Min Hsu, San Jose, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 571 days.

(21) Appl. No.: 17/305,093

(22) Filed: Jun. 30, 2021

(65) Prior Publication Data

US 2022/0014152 A1 Jan. 13, 2022

Related U.S. Application Data

(60) Provisional application No. 62/705,684, filed on Jul. 10, 2020.

(51) Int. Cl.
*H03F 3/04* (2006.01)
*H03F 1/02* (2006.01)
(Continued)

(52) U.S. Cl.
CPC .......... *H03F 1/0233* (2013.01); *H03F 3/245* (2013.01); *H04B 1/401* (2013.01);
(Continued)

(58) Field of Classification Search
CPC .. H03F 1/0233; H03F 3/245; H03F 2200/105; H03F 2200/451; H03F 1/0238;
(Continued)

(56) References Cited

U.S. PATENT DOCUMENTS 5,264,752 A 11/1993 Savicki
6,774,725 B2 8/2004 Miki et al.
(Continued)

FOREIGN PATENT DOCUMENTS

CN 1672322 9/2005
GB 2398648 8/2004
(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.
(Continued)

*Primary Examiner* — Khanh V Nguyen
(74) *Attorney, Agent, or Firm* — Knobbe, Martens, Olson & Bear, LLP

(57) ABSTRACT

Power amplifiers with supply capacitor switching are provided herein. In certain configurations, a power amplifier system includes a power amplifier that provides amplification to a radio frequency (RF) signal, a power management circuit that controls a voltage level of a supply voltage of the power amplifier, a supply capacitor, and a silicon-on-insulator (SOI) switch in series with the supply capacitor between the supply voltage and the a reference voltage, such as ground. The power management circuit is operable in multiple supply control modes including, for example, an average power tracking (APT) mode and an envelope tracking (ET) mode. Additionally, the SOI switch is controlled based on the supply control mode of the power management circuit.

20 Claims, 9 Drawing Sheets

(51) Int. Cl.
*H03F 3/24* (2006.01)
*H04B 1/401* (2015.01)
*H04W 52/02* (2009.01)

(52) U.S. Cl.
CPC ..... *H04W 52/028* (2013.01); *H03F 2200/105* (2013.01); *H03F 2200/451* (2013.01)

(58) Field of Classification Search
CPC .... H03F 1/0266; H03F 2200/102; H03F 3/19; H03F 1/0227; H03F 3/45475; H03F 3/189; H03F 2200/432; H03F 3/24; H03F 1/223; H03F 1/0222; H03F 3/195; H03F 3/04; H04B 1/401; H04B 1/04; H04B 2001/0491; H04B 2001/0408; H04B 2001/0441; H04B 2001/045; H04W 52/028; Y02D 30/70; H03G 3/20; H02M 3/1584; H02M 3/07; H02M 1/0045; H02M 3/1586; H02M 1/0095
USPC .......................................................... 330/297
See application file for complete search history.

(56) References Cited

U.S. PATENT DOCUMENTS

| | | | |
|---|---|---|---|
| 6,975,166 | B2 | 12/2005 | Grillo et al. |
| 7,139,538 | B2 | 11/2006 | Ono et al. |
| 7,400,865 | B2 | 7/2008 | Jarvinen |
| 7,482,869 | B2 | 1/2009 | Wilson |
| 7,486,135 | B2 | 2/2009 | Mu |
| 7,760,026 | B2 | 7/2010 | Young et al. |
| 8,598,950 | B2 | 12/2013 | Khesbak |
| 9,166,538 | B2 * | 10/2015 | Hong ............... H03F 3/191 |
| 9,257,940 | B2 | 2/2016 | Khesbak |
| 9,377,797 | B2 * | 6/2016 | Kay ............... H03F 1/0227 |
| 9,548,702 | B2 | 1/2017 | Khesbak |
| 9,859,846 | B2 | 1/2018 | Khesbak |
| 11,387,789 | B2 * | 7/2022 | Khlat ............... H03F 3/245 |
| 2002/0030543 | A1 | 3/2002 | French et al. |
| 2003/0155978 | A1 | 8/2003 | Pehlke |
| 2006/0178119 | A1 | 8/2006 | Jarvinen |
| 2007/0210771 | A1 | 9/2007 | Wilson et al. |
| 2007/0249304 | A1 | 10/2007 | Snelgrove et al. |
| 2007/0273449 | A1 | 11/2007 | Wilson |
| 2007/0279019 | A1 | 12/2007 | Wilson |
| 2009/0128236 | A1 | 5/2009 | Wilson |
| 2009/0289720 | A1 | 11/2009 | Takinami et al. |
| 2009/0302941 | A1 | 12/2009 | Wimpenny |
| 2016/0118943 | A1 | 4/2016 | Khesbak |
| 2020/0389132 | A1 | 12/2020 | Khlat et al. |
| 2021/0194517 | A1 | 6/2021 | Mirea et al. |
| 2022/0278650 | A1 | 9/2022 | Ripley et al. |

FOREIGN PATENT DOCUMENTS

| | | |
|---|---|---|
| GB | 2409115 | 11/2006 |
| GB | 2426392 | 5/2007 |
| GB | 2411062 | 11/2007 |
| JP | 2008-148098 | 6/2008 |
| JP | 2008-294812 | 12/2008 |
| KR | 10-2009-0103952 | 10/2009 |
| WO | WO 2008/091325 | 7/2008 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009 (6 pages).

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

* cited by examiner

POWER AMPLIFIERS WITH SUPPLY CAPACITOR SWITCHING

CROSS-REFERENCE TO RELATED APPLICATIONS

This application claims the benefit of priority under 35 U.S.C. § 119 of U.S. Provisional Patent Application No. 62/705,684, filed Jul. 10, 2020 and titled "POWER AMPLIFIERS WITH SUPPLY CAPACITOR SWITCHING," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to mobile phones, tablets, base stations, network access points, laptops, and wearable electronics. Power amplifiers provide amplification to RF signals, which can have a frequency in the range from about 30 kHz to 300 GHz, for instance, in the range of about 410 MHz to about 7.125 GHz for fifth generation (5G) communications in Frequency Range 1 (FR1) or in the range of about 24.250 GHz to about 52.600 GHz for 5G communications in Frequency Range 2 (FR2).

SUMMARY

In certain embodiments, the present disclosure relates a mobile device. The mobile device includes a power amplifier configured to amplify a radio frequency signal, a power management circuit configured to control a voltage level of a supply voltage of the power amplifier and operable in a selected supply control mode chosen from a plurality of supply control modes, and a front end system including a supply capacitor coupled to the supply voltage, and a silicon-on-insulator switch in series with the supply capacitor and controlled based on the selected supply control mode.

In various embodiments, the plurality of supply control modes includes an average power tracking mode and an envelope tracking mode. According to a number of embodiments, the front end system further includes a control circuit configured to turn on the silicon-on-insulator switch in the average power tracking mode and to turn off the silicon-on-insulator switch in the envelope tracking mode. In accordance with several embodiments, the front end system further includes at least one switch driver configured to selectively turn on the silicon-on-insulator switch and configured to receive at least one input control signal from the control circuit, the control circuit further including a voltage regulator configured to power the at least one switch driver with a regulated voltage. According to some embodiments, the average power tracking mode is a fourth generation mode and the envelope tracking mode is a fifth generation mode.

In several embodiments, the silicon-on-insulator switch includes a plurality of silicon-on-insulator field-effect transistors in series. According to some embodiments, the front-end system further includes a negative voltage generator configured to generate a negative voltage, at least a portion of the plurality of silicon-on-insulator field-effect transistors controlled with the negative voltage in an off state of the silicon-on-insulator switch. In accordance with a number of embodiments, a first portion of the plurality of silicon-on-insulator transistors are controlled with a ground voltage in the off state, and a second portion of the plurality of silicon-on-insulator transistors are controlled with the negative voltage in the off state. According to various embodiments, the first portion of the plurality of silicon-on-insulator transistors are interposed between the supply capacitor and the second portion of the plurality of silicon-on-insulator transistors. In accordance with some embodiments, the front end system further includes a first switch driver configured to control a first portion of the plurality of silicon-on-insulator transistors, and a second switch driver configured to control a second portion of the plurality of silicon-on-insulator transistors. According to a number of embodiments, the front-end system further includes a coupling capacitor connected between an input to the silicon-on-insulator switch and a first silicon-on-insulator field-effect transistor of the plurality of silicon-on-insulator field-effect transistors.

In various embodiments, the front-end system further includes a clamp connected between an input of the silicon-on-insulator switch and a ground voltage.

In some embodiments, the silicon-on-insulator switch is implemented on a semiconductor die fabricated using a silicon-on-insulator process. According to a number of embodiments, the front end system further includes an antenna switch implemented on the semiconductor die. In accordance with several embodiments, the front end system further includes a band switch implemented on the semiconductor die.

In certain embodiments, the present disclosure relates to a packaged module. The packaged module includes a package substrate, a first die attached to the package substrate and including a power amplifier configured to amplify a radio frequency signal and to receive power from a supply voltage controlled by a power management circuit, a supply capacitor attached to the package substrate and coupled to the supply voltage, and a second die attached to the package substrate and fabricated using a silicon-on-insulator process. The second die includes a silicon-on-insulator switch in series with the supply capacitor and controlled based on a selected supply control mode of the power management circuit.

In various embodiments, the selected supply control mode indicates one of an average power tracking mode or an envelope tracking mode. According to a number of embodiments, the packaged module further includes a control circuit configured to turn on the silicon-on-insulator switch in the average power tracking mode and to turn off the silicon-on-insulator switch in the envelope tracking mode. In accordance with some embodiments, the second die further includes at least one switch driver configured to selectively turn on the silicon-on-insulator switch and configured to receive at least one input control signal from the control circuit, the control circuit further including a voltage regulator configured to power the at least one switch driver with a regulated voltage. According to several embodiments, the average power tracking mode is a fourth generation mode and the envelope tracking mode is a fifth generation mode.

In some embodiments, the silicon-on-insulator switch includes a plurality of silicon-on-insulator field-effect transistors in series. According to several embodiments, the second die further includes a negative voltage generator configured to generate a negative voltage, at least a portion of the plurality of silicon-on-insulator field-effect transistors controlled with the negative voltage in an off state of the silicon-on-insulator switch. In accordance with various embodiments, a first portion of the plurality of silicon-on-insulator transistors are controlled with a ground voltage in the off state, and a second portion of the plurality of silicon-on-insulator transistors are controlled with the negative voltage in the off state. According to a number of embodiments, the first portion of the plurality of silicon-on-insulator transistors are interposed between the supply capacitor and the second portion of the plurality of silicon-on-insulator transistors. In accordance with several embodiments, the second die further includes a first switch driver configured to control a first portion of the plurality of silicon-on-insulator transistors, and a second switch driver configured to control a second portion of the plurality of silicon-on-insulator transistors. According to a number of embodiments, the second die further includes a coupling capacitor connected between an input to the silicon-on-insulator switch and a first silicon-on-insulator transistor of the plurality of silicon-on-insulator field-effect transistors.

In various embodiments, the second die further includes a clamp connected between an input of the silicon-on-insulator switch and a ground voltage.

In several embodiments, the packaged module further includes an antenna switch on the second die.

In a number of embodiments, the packaged module further includes a band switch on the second die.

In some embodiments, the packaged module further includes a supply pin configured to receive the supply voltage, and the power management circuit is external to the packaged module.

In certain embodiments, the present disclosure relates to a method of power amplification in a mobile device. The method includes amplifying a radio frequency signal using a power amplifier, controlling a voltage level of a supply voltage of the power amplifier using a power management circuit operable in a selected supply control mode chosen from a plurality of supply control modes, and controlling a silicon-on-insulator switch in series with a supply capacitor based on the selected supply control mode, the supply capacitor coupled to the supply voltage.

In various embodiments, the plurality of supply control modes includes an average power tracking mode and an envelope tracking mode. According to a number of embodiments, the method further includes turning on the silicon-on-insulator switch in the average power tracking mode and turning off the silicon-on-insulator switch in the envelope tracking mode. In accordance with some embodiments, the average power tracking mode is a fourth generation mode and the envelope tracking mode is a fifth generation mode.

In certain embodiments, the present disclosure relates to a power amplifier system. The power amplifier system includes a power amplifier configured to amplify a radio frequency signal, a power management circuit configured to control a voltage level of a supply voltage of the power amplifier and operable in a selected supply control mode chosen from a plurality of supply control modes, a supply capacitor coupled to the supply voltage, and a silicon-on-insulator switch in series with the supply capacitor and controlled based on the selected supply control mode.

In various embodiments, the plurality of supply control modes includes an average power tracking mode and an envelope tracking mode. According to a number of embodiments, the power amplifier system further includes a control circuit configured to turn on the silicon-on-insulator switch in the average power tracking mode and to turn off the silicon-on-insulator switch in the envelope tracking mode. In accordance with several embodiments, the power amplifier system further includes at least one switch driver configured to selectively turn on the silicon-on-insulator switch and configured to receive at least one input control signal from the control circuit, the control circuit further including a voltage regulator configured to power the at least one switch driver with a regulated voltage. According to some embodiments, the average power tracking mode is a fourth generation mode and the envelope tracking mode is a fifth generation mode.

In several embodiments, the silicon-on-insulator switch includes a plurality of silicon-on-insulator field-effect transistors in series.

In some embodiments, the power amplifier system further includes a negative voltage generator configured to generate a negative voltage, at least a portion of the plurality of silicon-on-insulator field-effect transistors controlled with the negative voltage in an off state of the silicon-on-insulator switch. According to a number of embodiments, a first portion of the plurality of silicon-on-insulator transistors are controlled with a ground voltage in the off state, and a second portion of the plurality of silicon-on-insulator transistors are controlled with the negative voltage in the off state. In accordance with several embodiments, the first portion of the plurality of silicon-on-insulator transistors are interposed between the supply capacitor and the second portion of the plurality of silicon-on-insulator transistors. According to various embodiments, the power amplifier system further includes a first switch driver configured to control a first portion of the plurality of silicon-on-insulator transistors, and a second switch driver configured to control a second portion of the plurality of silicon-on-insulator transistors. In accordance with a number of embodiments, the power amplifier system further includes a coupling capacitor connected between an input to the silicon-on-insulator switch and a first silicon-on-insulator field-effect transistor of the plurality of silicon-on-insulator field-effect transistors.

In several embodiments, the front-end system further includes a clamp connected between an input of the silicon-on-insulator switch and a ground voltage.

In various embodiments, the silicon-on-insulator switch is implemented on a semiconductor die fabricated using a silicon-on-insulator process. In accordance with a number of embodiments, the semiconductor die further includes an antenna switch. According to some embodiments, the semiconductor die further includes a band switch.

DETAILED DESCRIPTION OF EMBODIMENTS

Figure 1:
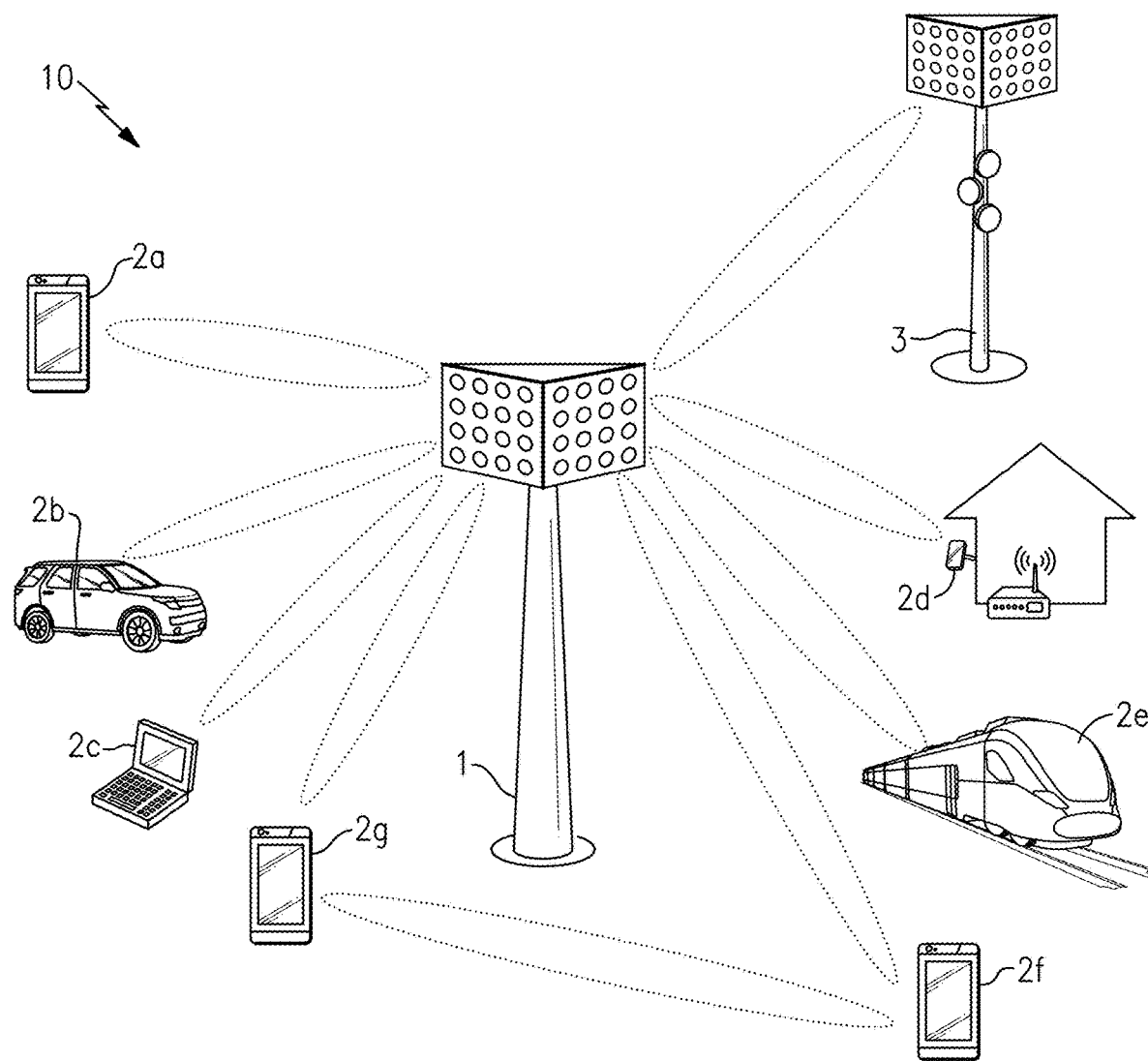
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
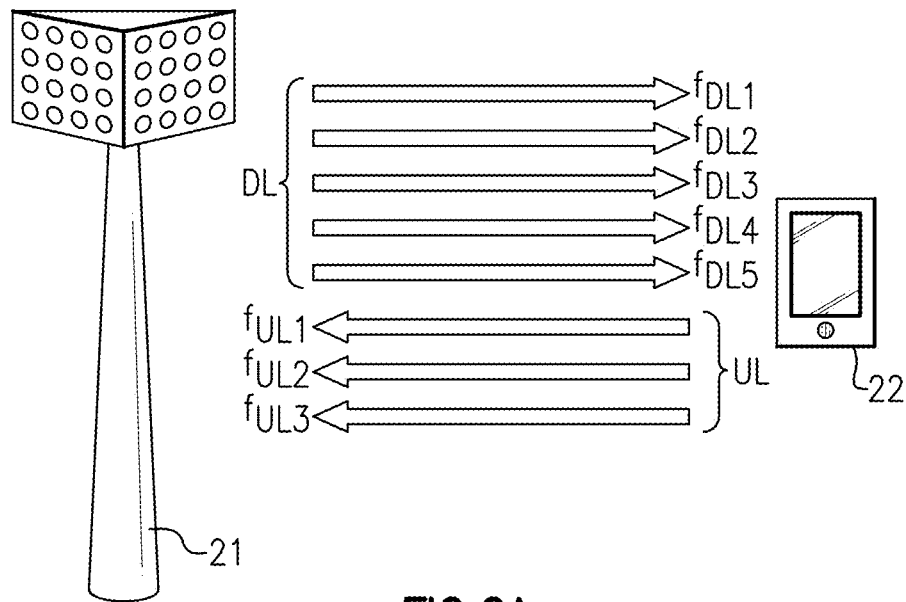
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
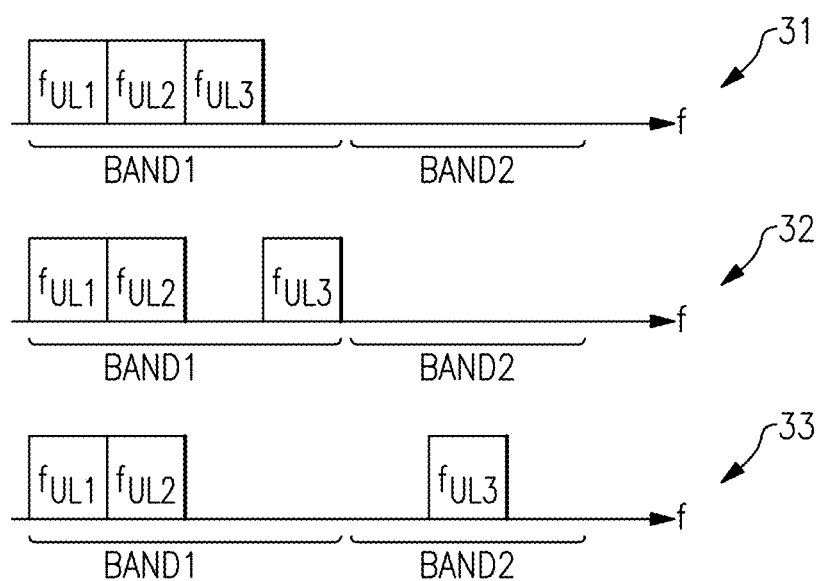
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
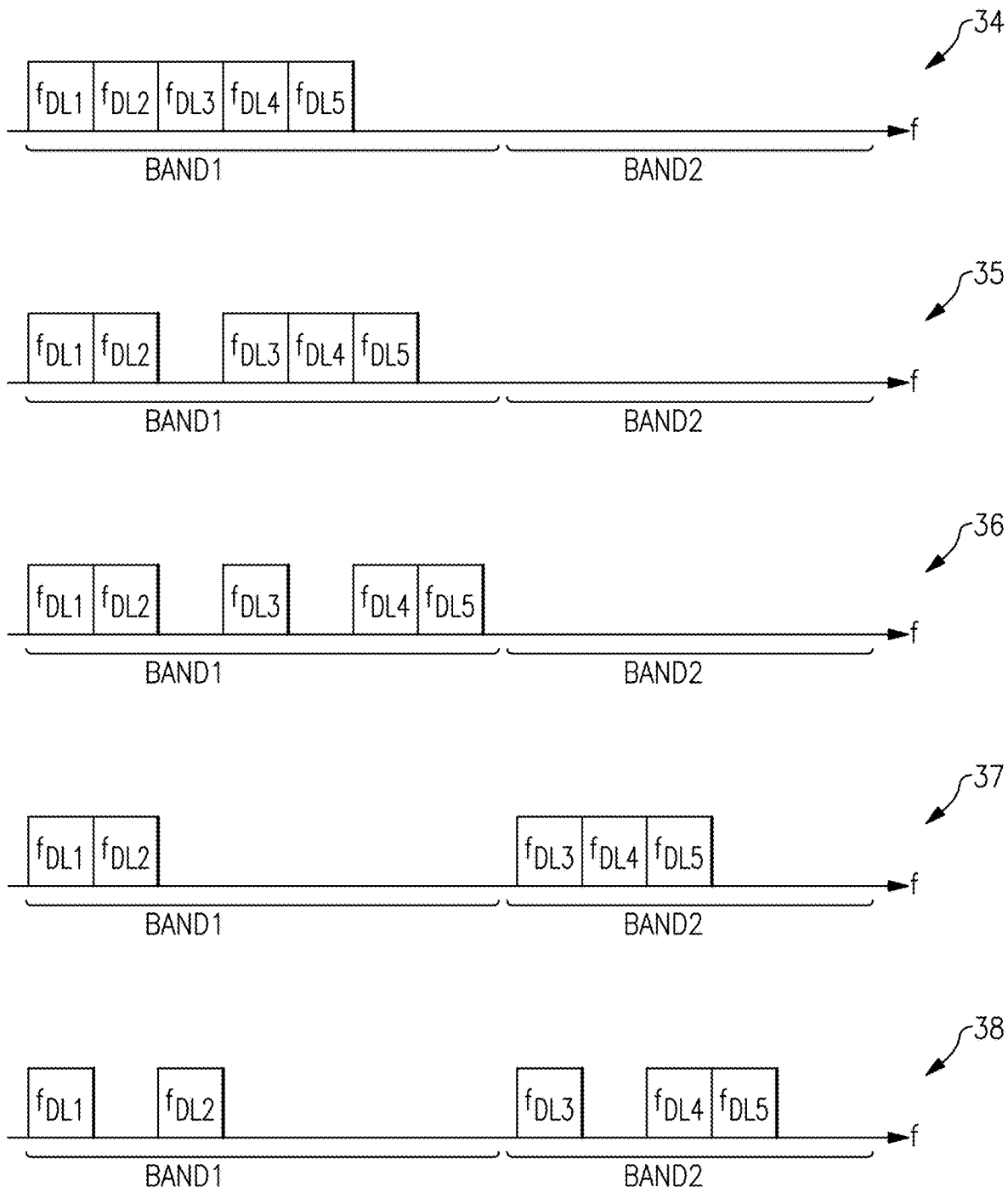
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Power Amplifiers with Supply Capacitor Switching

In mobile applications, such as cellular communication systems, it is important to prolong battery lifetime. One operation that consumes a significant amount of battery charge is power amplification.

To increase efficiency and thereby extend battery life, a mobile device can include a power management circuit for controlling a voltage level of the power amplifier's supply voltage. For example, the power management circuit can employ various power management techniques to change the voltage level of the power amplifier's supply voltage over time to improve the power amplifier's power added efficiency (PAE), thereby reducing power dissipation and extending battery life in mobile applications.

One technique for improving efficiency of a power amplifier is average power tracking (APT), in which a DC-to-DC converter and/or other suitable voltage regulator is used to generate a supply voltage for a power amplifier based on the power amplifier's average output power.

Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

Power amplifiers with supply capacitor switching are provided herein. In certain configurations, a power amplifier system includes a power amplifier that provides amplification to an RF signal, a power management circuit that controls a voltage level of a supply voltage of the power amplifier, a supply capacitor, and a silicon-on-insulator (SOI) switch in series with the supply capacitor between the supply voltage and the a reference voltage, such as ground. The power management circuit is operable in multiple supply control modes including, for example, an APT mode and an ET mode. Additionally, the SOI switch is controlled based on the supply control mode of the power management circuit.

Accordingly, a power amplifier can be designed to support multiple supply control modes, such as an APT mode and an ET mode, and operate with optimal or near optimal performance across such modes.

For example, a mobile device can include a shared power management circuit that can be configured in an APT mode or an ET mode depending on the power level and operating characteristics, for instance, whether using 3G, 4G, and/or 5G. In an APT mode, it is desirable for the power management circuit to drive large capacitance in the range of 1 uF whereas in an ET mode (particularly for 5G applications) it can be desirable for the load capacitance to be limited to a few hundreds of pF for wide envelope tracking bandwidth. For a 5G application in APT mode, it is desirable for a power amplifier to operate with a large supply capacitance in the range of a few nano-farad (nF) to meet the adjacent channel power ratio (ACPR) and/or adjacent channel leakage ratio (ACLR) specifications.

By including the SOI switch, the supply capacitor can be decoupled from the supply node in the ET mode by opening the SOI switch. In certain implementations, the SOI switch operates with low turn-on resistance in the range of 0.5 ohm (S2) or less, low off parasitic capacitance in the range of 1 pico-farad (pF) of less, fast turn on and turn off time, and ruggedness in the presence of overvoltage conditions, including electrostatic discharge (ESD). By implementing the SOI switch using an SOI process, such performance parameters can be achieved. In contrast, a supply capacitor switch fabricated in a bulk complementary metal-oxide-semiconductor (CMOS) process can suffer from higher on-state resistance, higher parasitic capacitance, and/or poor switch speed.

In certain implementations, the SOI switch is formed on an SOI die in which an antenna switch and/or band switch are also formed. By integrating the SOI switch in the band switch or antenna switch module (ASM) die, a need for a dedicated switch die for a supply capacitor switch is avoided.

Figure 3A:
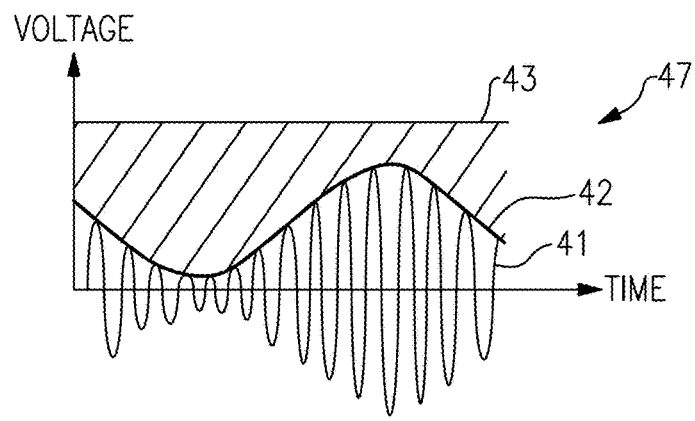
FIG. 3A is a graph showing a first example of power amplifier supply voltage versus time.

FIG. 3A is a graph 47 showing a first example of power amplifier supply voltage versus time. The graph 47 illustrates the voltage of an RF signal 41, the RF signal's envelope 42, and a power amplifier supply voltage 43 versus time. The graph 47 corresponds to one example of waveforms for an implementation in which the power amplifier supply voltage 43 is substantially fixed (DC).

It can be important that the power amplifier supply voltage 43 of a power amplifier has a voltage greater than that of the RF signal 41. For example, powering a power amplifier using a power amplifier supply voltage that has a magnitude less than that of the RF signal can clip the RF signal, thereby creating signal distortion and/or other problems. Thus, it can be important the power amplifier supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a wireless device.

Figure 3B:
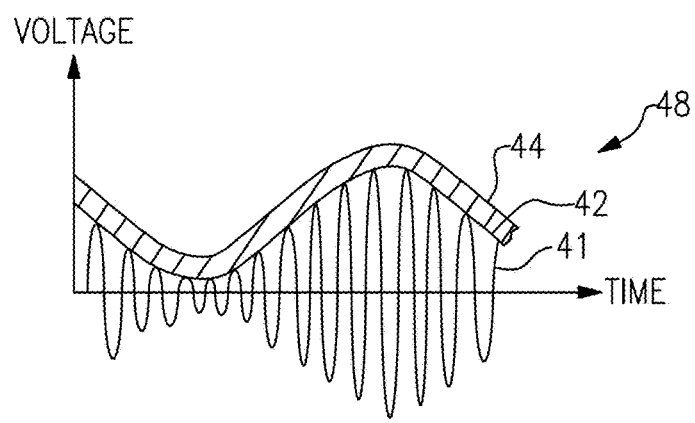
FIG. 3B is a graph showing a second example of power amplifier supply voltage versus time.

FIG. 3B is a graph 48 showing a second example of power amplifier supply voltage versus time. The graph 48 illustrates the voltage of an RF signal 41, the RF signal's envelope 42, and a power amplifier supply voltage 44 versus time. The graph 48 corresponds to one example of waveforms for an implementation in which the power amplifier supply voltage 44 is generated by envelope tracking.

Envelope tracking is a technique that can be used to increase power added efficiency (PAE) of a power amplifier system by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In contrast to the power amplifier supply voltage 43 of FIG. 3A, the power amplifier supply voltage 44 of FIG. 3B changes in relation to the envelope 42 of the RF signal 41. The area between the power amplifier supply voltage 44 and the envelope 42 in FIG. 3B is less than the area between the power amplifier supply voltage 43 and the envelope 42 in FIG. 3A, and thus the graph 48 of FIG. 3B can be associated with a power amplifier system having greater energy efficiency.

Figure 3C:
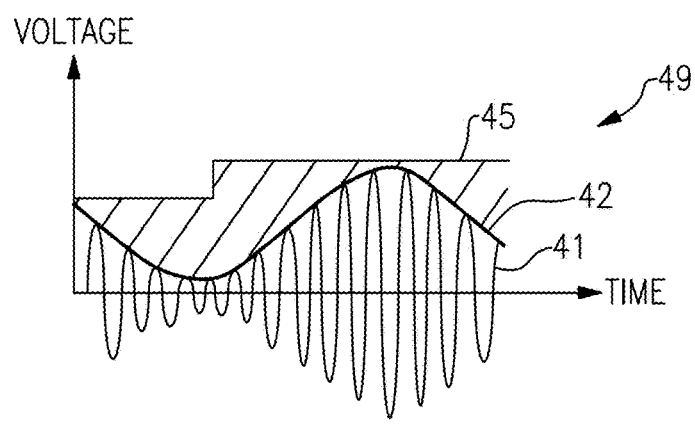
FIG. 3C is a graph showing a third example of power amplifier supply voltage versus time.

FIG. 3C is a graph 49 showing a third example of power amplifier supply voltage versus time. The graph 49 illustrates the voltage of an RF signal 41, the RF signal's envelope 42, and a power amplifier supply voltage 45 versus time. The graph 49 corresponds to one example of waveforms for an implementation in which the power amplifier supply voltage 45 is generated by average power tracking (APT).

APT is one technique for improving efficiency of a power amplifier, in which the voltage level of a power amplifier's supply voltage is controlled based on a power amplifier's average output power. When operating using APT, the voltage level of the power amplifier supply voltage can be substantially fixed for a particular time slot, but adjusted for a subsequent time slot based on average output power (for instance, transmission power control level). APT can achieve gain in efficiency relative to a fixed power amplifier supply voltage, but less efficiency gain compared to envelope tracking. However, envelope tracking can have a higher complexity, cost, and/or overhead relative to APT.

Figure 4:
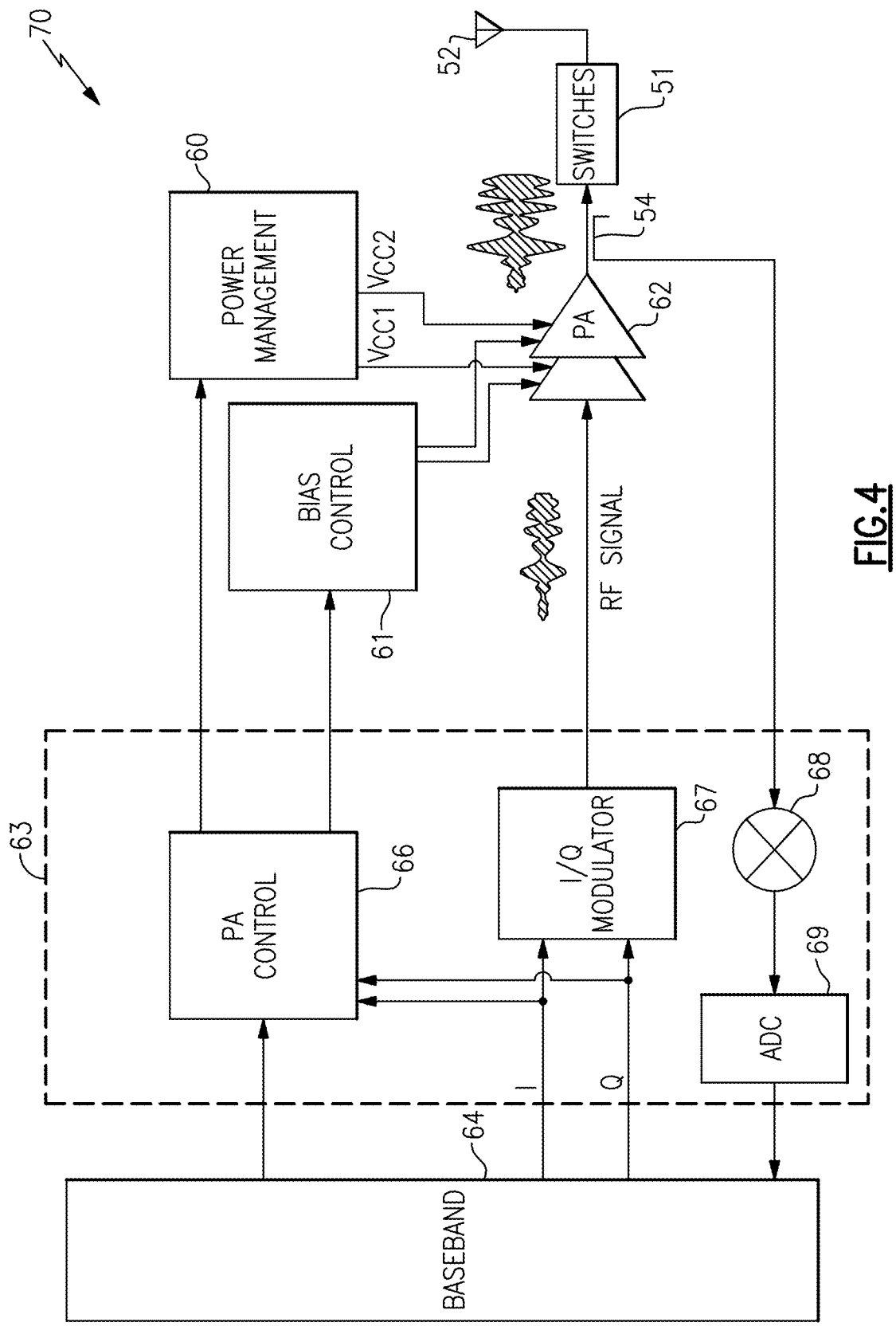
FIG. 4 is a schematic diagram of one embodiment of a power amplifier system.

FIG. 4 is a schematic diagram of one embodiment of a power amplifier system 70. The illustrated power amplifier system 70 includes switches 51, an antenna 52, a directional coupler 54, a power management circuit 60, a bias control circuit 61, a power amplifier 62, a transceiver 63, and a baseband processor 64.

Although FIG. 4 illustrates one embodiment of a power amplifier system, the teachings herein are applicable to power amplifier systems implemented in a wide variety of ways. For example, a power amplifier system can include more or fewer components, a different arrangement of components, and/or components implemented in different ways.

In the illustrated embodiment, the transceiver 63 includes a power amplifier control circuit 66, an I/Q modulator 67, a mixer 68, and an analog-to-digital converter (ADC) 69. Although not illustrated in FIG. 4 for clarity, the transceiver 63 can also process signals received from one or more antennas (for example, the antenna 52 and/or other antenna(s)) by way of one or more receive paths. Furthermore, the transceiver 63 can be implemented in other ways, including, but not limited to, using different implementations of transmit path(s), observation path(s), and/or power amplifier control circuitry.

The baseband signal processor 64 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 67 in a digital format. The baseband processor 64 can be any suitable processor configured to process a baseband signal. For instance, the baseband processor 64 can include a digital signal processor, a microprocessor, a programmable core, or any combination thereof. Moreover, in some implementations, two or more baseband processors 64 can be included in the power amplifier system 70.

The I/Q modulator 67 can be configured to receive the I and Q signals from the baseband processor 64 and to process the I and Q signals to generate an RF signal. For example, the I/Q modulator 67 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 62. In certain implementations, the I/Q modulator 67 can include one or more filters configured to filter frequency content of signals processed therein.

The power amplifier 62 can receive the RF signal from the I/Q modulator 67, and when enabled can provide an amplified RF signal to the antenna 52 via the switches 51. The directional coupler 54 can be positioned between the output of the power amplifier 62 and the input of the switches 51, thereby allowing an output power measurement of the power amplifier 62 that does not include insertion loss of the switches 51. However, other configurations of power measurement are possible.

The switches 51 includes an antenna switch and/or band switch, in this embodiment. The switches 51 can further include one or more supply control switches (each connected to a corresponding supply capacitor) implemented in accordance with the teachings herein. Such supply control switches can be used for any or all of the stages of the power amplifier 62.

In the illustrated configuration, the sensed output signal from the directional coupler 54 is provided to the mixer 68, which multiplies the sensed output signal by a reference signal of a controlled frequency. The mixer 68 operates to generate a downshifted signal by downshifting the sensed output signal's frequency content. The downshifted signal can be provided to the ADC 69, which can convert the downshifted signal to a digital format suitable for processing by the baseband processor 64. By including a feedback path between the output of the power amplifier 62 and the baseband processor 64, the baseband processor 64 can be configured to dynamically adjust the I and Q signals to optimize the operation of the power amplifier system 70. For example, configuring the power amplifier system 70 in this manner can aid in controlling the PAE and/or linearity of the power amplifier 62.

In the illustrated embodiment, the power management circuit 60 receives a power control signal from the transceiver 63, and controls the supply voltages of the power amplifier 62. In certain implementations, the transceiver 63 is electrically connected to the power management circuit 60 via a serial interface, and the power management circuit 60 receives the power control signal over the serial interface.

As shown in FIG. 4, the power management circuit 60 generates a first supply voltage $V_{CC1}$ for powering an input stage of the power amplifier 62 and a second supply voltage $V_{CC2}$ for powering an output stage of the power amplifier 62. The power management circuit 60 can control the voltage level of the first supply voltage $V_{CC1}$ and/or the second supply voltage $V_{CC2}$ to enhance the power amplifier system's PAE. Although an embodiment with two controllable supply voltages is shown, a power management circuit can control the voltage levels of more or fewer supply voltages. In certain implementations, a power amplifier operates with one or more controllable supply voltages and one or more substantially fixed supply voltages. In one example, a power amplifier includes a first stage (for instance, an input stage) using a fixed supply voltage and a second stage (for instance, an output stage) using a controllable supply voltage.

In the illustrated embodiment, the power control signal instructs the power management circuit 60 to operate in a particular supply control mode, such as an APT mode or an ET mode. Thus, the power amplifier control circuit 66 of the transceiver 63 controls the selected supply control mode, in this embodiment.

As shown in FIG. 4, the bias control circuit 61 receives a bias control signal from the transceiver 63, and generates bias control signals for the power amplifier 62. Additionally, the bias control circuit 61 generates the bias control signals based on the bias control signal.

The bias control signal identifies the supply control mode that the power management circuit 60 is operating in, and the bias control circuit 61 generates the bias control signals based on the indicated supply control mode. In certain implementations, the transceiver 63 is electrically connected to the bias control circuit 61 via a serial interface, and the bias control circuit 61 receives a control word that indicates the selected supply control mode over the serial interface.

Figure 5:
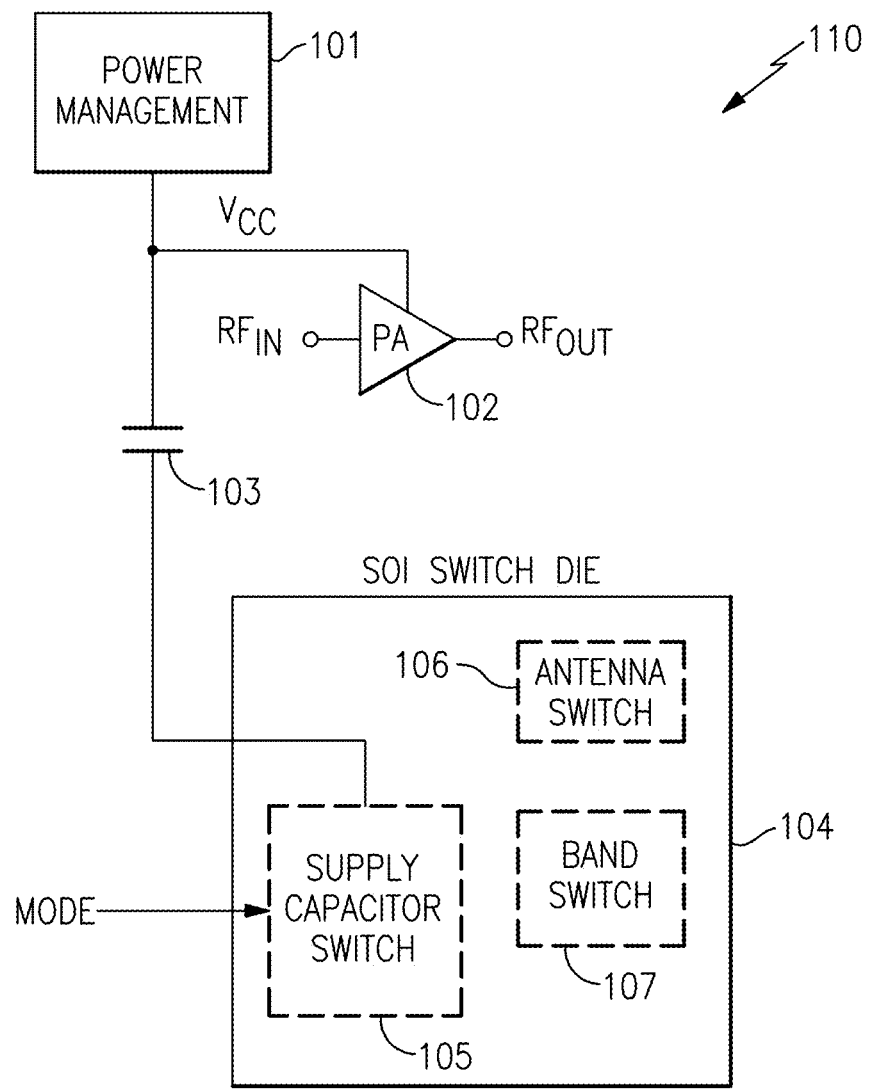
FIG. 5 is a schematic diagram of another embodiment of a power amplifier system.

FIG. 5 is a schematic diagram of another embodiment of a power amplifier system 110. The power amplifier system 110 includes a power management circuit 101, a power amplifier 102, a supply capacitor 103, and an SOI switch die 104.

As shown in FIG. 5, the power amplifier 102 receives an RF input signal $RF_{IN}$, which the power amplifier 102 amplifies to generate an RF output signal $RF_{OUT}$. Although depicted as including a single stage, the power amplifier 102 can include additional stages. The power amplifier 102 receives a power amplifier supply voltage $V_{CC}$ from the power management circuit 101. In certain implementations, the power amplifier 102 includes a bipolar transistor having a collector that receives the power amplifier supply voltage $V_{CC}$ through a choke inductor, or a field-effect transistor (FET) having a drain that receives the power amplifier supply voltage $V_{CC}$ through the choke inductor.

The power management circuit 101 controls a voltage level of the power amplifier supply voltage $V_{CC}$ of the power amplifier 102. The power management circuit 101 is a multi-mode power management circuit operable in two or more modes which can include an APT mode and an ET mode.

As shown in FIG. 5, the SOI switch die 104 incudes a supply capacitor switch 105, an antenna switch 106, and a band switch 107. By integrating the supply capacitor switch 106 with one or more other switches, a lower cost and/or more compact solution is obtained. For example, the teachings herein can be used to achieve an integrated RF front end system.

The supply capacitor switch 105 is controlled (for instance, opened or closed) based on a mode of the power management circuit 101 indicated by a mode signal MODE. In certain implementations, the supply capacitor switch 105 is opened when the mode signal MODE indicates the mode is ET mode, and otherwise closed.

As shown in FIG. 5, the supply capacitor 103 is connected in series with the supply capacitor switch 105. For instance, in this example, the supply capacitor 103 includes a first terminal connected to the power amplifier supply voltage $V_{CC}$ and a second terminal connected to the supply capacitor switch 105.

By controlling a state of the supply capacitor switch 105, the supply capacitor 103 can be selectively included for filtering/stabilizing the power amplifier supply voltage $V_{CC}$. For example, when the supply capacitor switch 105 is closed (turned on), the supply capacitor 103 is included for operation and loads the output of the power management circuit 101. However, when the supply capacitor switch 105 is opened (turned off), one terminal of the supply capacitor 103 is electrically floating and the supply capacitor 103 is effectively decoupled from the power amplifier supply voltage $V_{CC}$.

Figure 6:
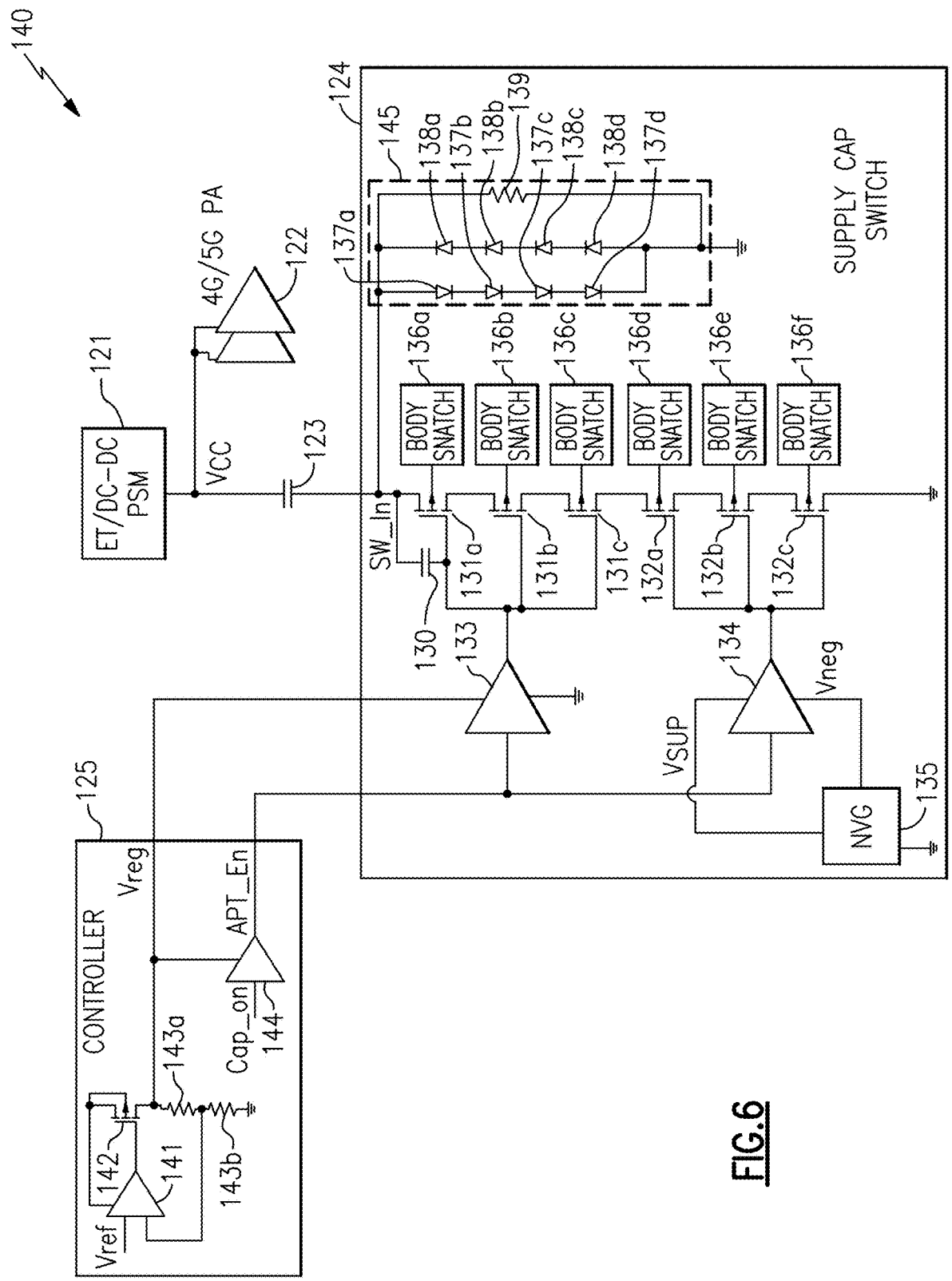
FIG. 6 is a schematic diagram of another embodiment of a power amplifier system.

FIG. 6 is a schematic diagram of another embodiment of a power amplifier system 140. The power amplifier system 140 includes a power management circuit 121, a power amplifier 122, a supply capacitor 123, an SOI supply capacitor switch 124, and a controller 125.

In the illustrated embodiment, the power management circuit 121 is a multi-mode power supply management (PSM) circuit that provides ET in a first mode or DC-to-DC (DC-DC) conversion for APT in a second mode.

The power amplifier 122 of FIG. 6 is a 4G/5G multi-stage power amplifier including an input stage and an output stage. Both the input stage and the output stage are powered by a power amplifier supply voltage $V_{CC}$ from the power management circuit 121, in this embodiment.

The controller 125 includes a low dropout (LDO) voltage regulator including a differential amplifier 141, a regulator transistor 142, a first feedback resistor 143a, and a second feedback resistor 143b. For example, an output of the differential amplifier 141 controls a gate of the regulator transistor 142 to generate a regulated voltage $V_{reg}$. The first feedback resistor 1443a and the second feedback resistor 143b are connected between the regulated voltage $V_{reg}$ and ground, and serve to generate a feedback voltage for a first input of the differential amplifier 141. The differential amplifier 142 further includes a second input that receives a reference voltage $V_{ref}$, which can be any suitable reference voltage, such as a bandgap reference voltage.

As shown in FIG. 6, the controller 125 further includes a buffer 144 that is powered by the regulated voltage $V_{reg}$. The buffer 144 receives a control input signal Cap_on indicating whether the power management circuit 121 is operating in a mode in which the supply capacitor 123 should be active and load the output of the power management circuit 121. The buffer outputs a switch enable signal APT_en for opening or closing the SOI supply capacitor switch 124.

In the illustrated embodiment, the SOI supply capacitor switch 124 includes a coupling capacitor 130, a first group of FETs 131a-131c (FET 131a, FET 131b, and FET 131c), a second group of FETs 132a-132c (FET 132a, FET 132b, and FET 132c), a first switch driver 133, a second switch driver 134, a negative voltage generator 135, body snatch circuits 136a-136f (body snatch circuit 136a, body snatch circuit 136b, body snatch circuit 136c, body snatch circuit 136d, body snatch circuit 136e, and body snatch circuit 136f), and a clamp circuit 145 including a first group of diodes 137a-137d (diode 137a, diode 137b, diode 137c, and diode 137d), a second group of diodes 138a-138d (diode 138a, diode 138b, diode 138c, and diode 138d), and a resistor 139. The SOI supply capacitor switch 124 can be implemented using an SOI die, which can include one or more other switches (for instance, an antenna switch and/or a band switch).

As shown in FIG. 6, the first group of FETs 131a-131c and the second group of FETs 132a-132c are connected in series between a switch input SW_In and ground. Additionally, the switch input SW_In is connected to a first terminal of the supply capacitor 123. The first group of FETs 131a-131c and the second group of FETs 132a-132c are collectively referred to herein as a series of FETs or a stack of FETs.

Using a series of FETs aids in providing ruggedness in the presence of RF voltage swing and/or large voltage conditions. For example, increasing the number of FETs in the series increases a maximum AC voltage that can be present at the switch input SW_In. Although six FETs are depicted in the series of FETs, more or fewer FETs can be included. Furthermore, although three FETs are depicted in each group of FETs, more or fewer can be included in each group, and the number of FETs in each group need not be equal.

The switch enable signal APT_en is used to turn on or off the series of FETs to open or close the SOI supply capacitor switch 124. Thus, the switch enable signal APT_en selectively turns on the SOI supply capacitor switch 124. As show in FIG. 6, the first group of FETs 131a-131c is controlled by the first switch driver 133, which receives a first supply voltage corresponding to the regulated voltage $V_{reg}$ and a second supply voltage correspond to ground. Additionally, the second group of FETs 132a-132c is controlled by the second switch driver 134, which receives a first supply voltage corresponding to a positive supply voltage Vsup (which can be the regulated voltage $V_{reg}$ in some implementations) and a second supply voltage corresponding to a negative supply voltage Vneg generated by the negative voltage generator 135. In certain implementations, the negative voltage generator 135 includes a negative charge pump. In this example, the negative voltage generator 135 is powered by the positive supply voltage Vsup and ground.

In the illustrated embodiment, the first group of FETs 131a-131c and the second group of FETs 132a-132c operate at least with different off-state voltages. Additionally, the first group of FETs 131a-131c is positioned between the supply capacitor 123 and the second group of FETs 132a-132c. Implementing the SOI supply capacitor switch 124 in this manner provides the advantage of high off-state impedance and high isolation arising from using a negative off-state voltage, while also limiting noise from the negative voltage generator 135 (for instance, oscillator noise of a negative charge pump) from reaching the power amplifier supply voltage $V_{CC}$ by way of the supply capacitor 123 and FET parasitics.

The coupling capacitor 130 aids in increasing ruggedness of the SOI supply capacitor switch 124 by providing coupling from the switch input SW_In to the gates of the first group of FETs 131a-131c, thereby preventing excessive gate-to-drain voltages ($V_{GD}$) from occurring.

As shown in FIG. 6, the body snatch circuits 136a-136f are included for controlling the body voltage of each FET in the series of FETs. In one example, the body snatch controls a body of a particular FET based on the lesser of a drain voltage or a source voltage of that FET. By including the body snatch circuits 136a-136f, current arising from parasitic body-to-drain and/or body-to-source diodes is inhibited.

In the illustrated embodiment, the clamp circuit 145 is included between the switch input SW_In and ground. The resistor 139 serves to control a DC voltage of the switch input SW_In, while the first group of diodes 137a-137d and the second group of diodes 138a-138d serves to clamp excess overvoltage or undervoltage conditions with respect to the switch input SW_In. Although one example of a clamp circuit is depicted, other implementations of clamp circuits are possible.

Figure 7A:
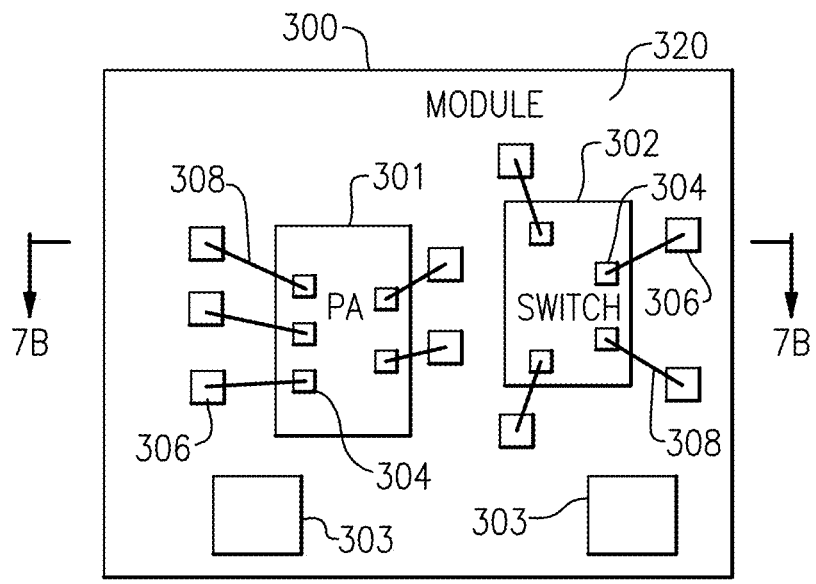
FIG. 7A is a schematic diagram of one embodiment of a packaged module.
Figure 7B:
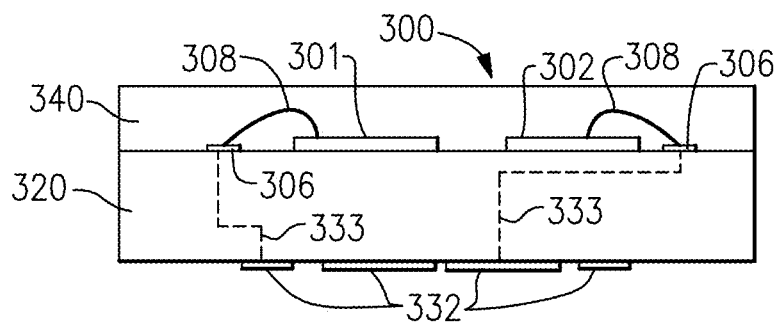
FIG. 7B is a schematic diagram of a cross-section of the packaged module of FIG. 7A taken along the lines 7B-7B.

FIG. 7A is a schematic diagram of one embodiment of a packaged module 300. FIG. 7B is a schematic diagram of a cross-section of the packaged module 300 of FIG. 7A taken along the lines 7B-7B.

The packaged module 300 includes a power amplifier die 301, a switch die 302, surface mount components 303, wirebonds 308, a package substrate 320, and encapsulation structure 340. The package substrate 320 includes pads 306 formed from conductors disposed therein. Additionally, the dies 301, 302 include pads 304, and the wirebonds 308 have been used to connect the pads 304 of the dies 301, 302 to the pads 306 of the package substrate 320.

The power amplifier die 301 and the switch die 302 are implemented in accordance with one or more features of the present disclosure. In certain implementations, the switch die 302 includes a supply capacitor switch that is in series with a supply capacitor formed at least in part using a surface mount capacitor attached to the package substrate. To enhance integration, the switch die 302 can include an antenna switch (for instance, a transmit/receive (T/R) switch) and/or a band switch. The switch die 302 can include a pin or pad (any of pads 304) that receives a control signal indicating the supply control mode of a power management circuit (which can be included on the packaged module 300 or be external thereto).

In certain implementations, the dies 301, 302 are manufactured using different processing technologies. In one example, the power amplifier die 301 is manufactured using a heterojunction bipolar transistor (HBT) process, and the switch die 302 is manufactured using an SOI process.

The packaging substrate 320 can be configured to receive a plurality of components such as the dies 301, 302 and the surface mount components 303, which can include, for example, surface mount capacitors and/or inductors.

As shown in FIG. 7B, the packaged module 300 is shown to include a plurality of contact pads 332 disposed on the side of the packaged module 300 opposite the side used to mount the dies 301, 302. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the dies 301, 302 and/or the surface mount components 303. As shown in FIG. 7B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 8:
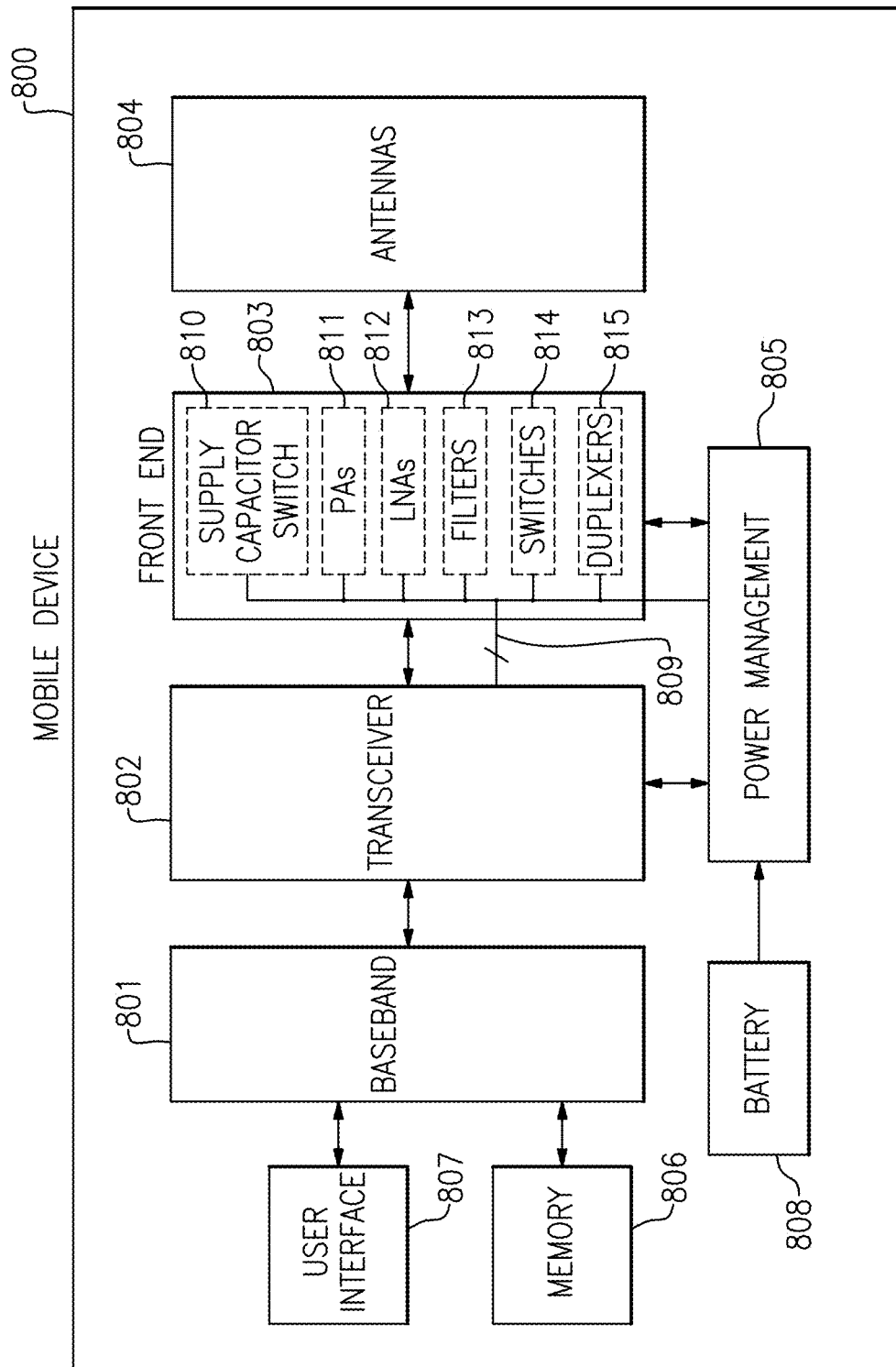
FIG. 8 is a schematic diagram of one embodiment of a mobile device.

FIG. 8 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

Although the mobile device 800 illustrates one example of an RF system that can include one or more features of the present disclosure, the teachings herein are applicable to electronic systems implemented in a wide variety of ways.

The mobile device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 8 as the transceiver 802. In one example, separate components (for instance, separate circuits or dies) can be provided for handling certain types of RF signals.

As shown in in FIG. 8, the transceiver 802 is connected to the front end system 803 and to the power management circuit 805 using a serial interface 809. All or part of the illustrated RF components can be controlled by the serial interface 809 to configure the mobile device 800 during initialization and/or while fully operational. In another embodiment, the baseband processor 801 is additionally or alternative connected to the serial interface 809 and operates to configure one or more RF components, such as components of the front end system 803 and/or power management system 805.

The front end system 803 aids is conditioning signals transmitted to and/or received from the antennas 804. In the illustrated embodiment, the front end system 803 includes one or more supply capacitor switches 810, one or more power amplifiers (PAs) 811, one or more low noise amplifiers (LNAs) 812, one or more filters 813, one or more switches 814, and one or more duplexers 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 8, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a power amplifier (PA) supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

The power management system 805 can operate in a selectable supply control mode, such an APT mode or an ET mode. In the illustrated embodiment, the selected supply control mode of the power management system 805 is controlled by the transceiver 802. In certain implementations, the transceiver 802 controls the selected supply control mode using the serial interface 809. The one or more supply control switches 810 are opened or closed based on the selected supply control mode.

As shown in FIG. 8, the power management system 805 receives a battery voltage from the battery 808. The battery 808 can be any suitable battery for use in the mobile device 800, including, for example, a lithium-ion battery. Although the power management system 805 is illustrated as separate from the front end system 803, in certain implementations all or part (for instance, a PA supply control circuit) of the power management system 805 is integrated into the front end system 803.

Applications

Some of the embodiments described above have provided examples in connection with wireless devices or mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a power amplifier configured to amplify a radio frequency signal;
a power management circuit configured to control a voltage level of a supply voltage of the power amplifier, the power management circuit operable in a selected supply control mode chosen from a plurality of supply control modes including an average power tracking mode and an envelope tracking mode; and
a front end system including a supply capacitor coupled to the supply voltage, and a silicon-on-insulator switch in series with the supply capacitor and controlled based on the selected supply control mode, the front end system further including a control circuit configured to turn on the silicon-on-insulator switch in the average power tracking mode and to turn off the silicon-on-insulator switch in the envelope tracking mode.

2. A mobile device comprising:
a power amplifier configured to amplify a radio frequency signal;
a power management circuit configured to control a voltage level of a supply voltage of the power amplifier, the power management circuit operable in a selected supply control mode chosen from a plurality of supply control modes; and
a front end system including a supply capacitor coupled to the supply voltage, and a silicon-on-insulator switch in series with the supply capacitor and controlled based on the selected supply control mode, the silicon-on-insulator switch including a plurality of silicon-on-insulator field-effect transistors in series.

3. The mobile device of claim 2 wherein the front-end system further includes a negative voltage generator configured to generate a negative voltage, at least a portion of the plurality of silicon-on-insulator field-effect transistors controlled with the negative voltage in an off state of the silicon-on-insulator switch.

4. The mobile device of claim 3 wherein a first portion of the plurality of silicon-on-insulator field-effect transistors are controlled with a ground voltage in the off state, and a second portion of the plurality of silicon-on-insulator field-effect transistors are controlled with the negative voltage in the off state.

5. The mobile device of claim 4 wherein the first portion of the plurality of silicon-on-insulator field-effect transistors are interposed between the supply capacitor and the second portion of the plurality of silicon-on-insulator field-effect transistors.

6. The mobile device of claim 3 wherein the front end system further includes a first switch driver configured to control a first portion of the plurality of silicon-on-insulator field-effect transistors, and a second switch driver configured to control a second portion of the plurality of silicon-on-insulator transistors.

7. The mobile device of claim 2 wherein the front-end system further includes a coupling capacitor connected between an input to the silicon-on-insulator switch and a first silicon-on-insulator field-effect transistor of the plurality of silicon-on-insulator field-effect transistors.

8. A mobile device comprising:
a power amplifier configured to amplify a radio frequency signal;
a power management circuit configured to control a voltage level of a supply voltage of the power amplifier, the power management circuit operable in a selected supply control mode chosen from a plurality of supply control modes; and
a front end system including a supply capacitor coupled to the supply voltage, and a silicon-on-insulator switch in series with the supply capacitor and controlled based on the selected supply control mode, the front-end system further includes a clamp connected between an input of the silicon-on-insulator switch and a ground voltage.

9. The mobile device of claim 8 wherein the plurality of supply control modes includes an average power tracking mode and an envelope tracking mode.

10. The mobile device of claim 9 wherein the front end system further includes a control circuit configured to turn on the silicon-on-insulator switch in the average power tracking mode and to turn off the silicon-on-insulator switch in the envelope tracking mode.

11. The mobile device of claim 10 wherein the front end system further includes at least one switch driver configured to selectively turn on the silicon-on-insulator switch and configured to receive at least one input control signal from the control circuit, the control circuit further including a voltage regulator configured to power the at least one switch driver with a regulated voltage.

12. A power amplifier system comprising:
a power amplifier configured to amplify a radio frequency signal;
a power management circuit configured to control a voltage level of a supply voltage of the power amplifier, the power management circuit operable in a selected supply control mode chosen from a plurality of supply control modes;
a supply capacitor coupled to the supply voltage; and
a silicon-on-insulator switch in series with the supply capacitor and controlled based on the selected supply control mode, the silicon-on-insulator switch including a plurality of silicon-on-insulator field-effect transistors in series.

13. The power amplifier system of claim 12 wherein the plurality of supply control modes includes an average power tracking mode and an envelope tracking mode.

14. The power amplifier system of claim 13 further comprising a control circuit configured to turn on the silicon-on-insulator switch in the average power tracking mode and to turn off the silicon-on-insulator switch in the envelope tracking mode.

15. The power amplifier system of claim 14 further comprising at least one switch driver configured to selectively turn on the silicon-on-insulator switch and configured to receive at least one input control signal from the control circuit, the control circuit further including a voltage regulator configured to power the at least one switch driver with a regulated voltage.

16. The power amplifier system of claim 12 wherein a ground voltage controls a first portion of the plurality of silicon-on-insulator field-effect transistors in the off state, and the power amplifier system further includes a negative voltage generator configured to generate a negative voltage that controls a second portion of the plurality of silicon-on-insulator field-effect transistors in the off state.

17. The power amplifier system of claim 12 wherein the silicon-on-insulator switch is implemented on a semiconductor die fabricated using a silicon-on-insulator process, and the semiconductor die further includes at least one of an antenna switch or a band switch.

18. The power amplifier system of claim 16 wherein the first portion of the plurality of silicon-on-insulator field-effect transistors are interposed between the supply capacitor and the second portion of the plurality of silicon-on-insulator field-effect transistors.

19. The power amplifier system of claim 16 wherein the front end system further includes a first switch driver configured to control the first portion of the plurality of silicon-on-insulator field-effect transistors, and a second switch driver configured to control the second portion of the plurality of silicon-on-insulator field-effect transistors.

20. The power amplifier system of claim 12 wherein the front-end system further includes a coupling capacitor connected between an input to the silicon-on-insulator switch and a first silicon-on-insulator field-effect transistor of the plurality of silicon-on-insulator field-effect transistors.

* * * * *